United States Patent [19]

Schmitt

[11] Patent Number: 5,278,506

[45] Date of Patent: Jan. 11, 1994

[54] METHOD AND CIRCUIT FOR OPERATING A MAGNETIC RESONANCE IMAGING APPARATUS FOR PRODUCING TOMOGRAMS IN AN ARBITRARY POSITION

[75] Inventor: Franz Schmitt, Erlangen, Fed. Rep. of Germany

[73] Assignee: Siemens Aktiengesellschaft, Munich, Fed. Rep. of Germany

[21] Appl. No.: 842,999

[22] Filed: Feb. 28, 1992

[30] Foreign Application Priority Data

Mar. 8, 1991 [DE] Fed. Rep. of Germany ....... 4107515

[51] Int. Cl.⁵ .......................................... G01R 33/20
[52] U.S. Cl. .................................... 324/322; 324/309; 324/307
[58] Field of Search .................. 324/309, 307, 300; 128/653.2

[56] References Cited

U.S. PATENT DOCUMENTS

| | | | |
|---|---|---|---|
| 4,628,264 | 12/1986 | Rzedzian | 324/322 |
| 4,740,748 | 4/1988 | Rzedzian | 324/309 |
| 4,818,942 | 4/1989 | Rzedzian | 324/309 |
| 5,084,675 | 1/1992 | Reinfelder et al. | |
| 5,162,730 | 11/1992 | Schmitt et al. | 324/309 |

FOREIGN PATENT DOCUMENTS 0076054 9/1982 European Pat. Off. .
0108421 11/1983 European Pat. Off. .
0270320 11/1987 European Pat. Off. .
3643577 12/1986 Fed. Rep. of Germany .

OTHER PUBLICATIONS

"Nuclear Magnetic Resonance Imaging in Medicine and Biology," Morris, 1986 pp. 214–225.
"NMR Imaging Techniques and Applications: A Review," Bottomley, Review of Scientific Instrumentation 53(9) Sep. 1982, pp. 1319–1335.
"40 Millisecond Instant Long Axis Heart Imaging," Weisskoff et al., Book of Abstracts, SMRM 1990, p. 123.

Primary Examiner—Michael J. Tokar
Assistant Examiner—Raymond Y. Mah
Attorney, Agent, or Firm—Hill, Steadman & Simpson

[57] ABSTRACT

A method and circuit for operating a magnetic resonance imaging apparatus to produce tomograms in an arbitrary position (plane) generate logic gradients which are arbitrarily spatially oriented by a combination of a number of physical magnetic field gradients. At least one gradient coil is operated in a resonant circuit. The logic gradients do not chronologically overlap. A logic read-out gradient can have gaps (non-signal regions) in the region of its zero-axis crossings, at which time a logic phase-coding gradient can be activated.

3 Claims, 5 Drawing Sheets

METHOD AND CIRCUIT FOR OPERATING A MAGNETIC RESONANCE IMAGING APPARATUS FOR PRODUCING TOMOGRAMS IN AN ARBITRARY POSITION

BACKGROUND OF THE INVENTION

1. Field of the Invention

The present invention is directed to a method for operating a magnetic resonance imaging apparatus to produce tomograms in arbitrarily oriented planes, as well as to a circuit for operating a magnetic resonance imaging apparatus wherein one gradient coil is operated in a resonant circuit.

2. Description of the Prior Art a magnetic resonance imaging apparatus in which one gradient coil is operated in a resonant circuit is used, for example in the echo planar imaging (EPI) method, as described, for example, in European Application 0 076 054. Typically in the EPI method, the raw data for the construction of a complete tomogram are acquired after a single excitation of the examination subject. The high switching speed of, in particular, the read-out gradient which is necessary for this purpose is isually achieved by operating the gradient coil which generates the read-out gradient in a resonant circuit.

Image acquisition in magnetic resonance tomography usually ensues slice-by-slice, with a slice of the examination subject being first selectively excited, with only signals from this slice then being received. The image acquired from these signals then represents a tomogram in the selected slice. The production of tomograms in arbitrarily rotated planes is advantageous for many applications, so that the information relevant for the examination is contained in one sectional plane. For this purpose, it is necessary that slices which are arbitrarily spatially oriented must be excited and read out. This can be achieved using traditional gradients, i.e., gradients which are not switched resonantly, by generating resulting gradients having an arbitrary spatial orientation by simultaneously activating a plurality of gradient coils, and by a corresponding dimensioning of the "physical" gradient, i.e., the gradient produced by the individual gradient coils.

For distinction from the aforementioned physical gradients, the resulting gradients shall be referred to herein as "logic" gradients.

The employment of tilted slices has been proposed for use in the EPI method in "40 Millisecond Instant Long Axis Heart Imaging," Weisskopf et al., Book of Abstracts, SMRM 1990, page 123. Only a tilting around the axis of the frequency-coding gradient, however, can be achieved by controlling the slice selection gradient and the phase-coding gradient, as proposed in this article. A combination of all three physical gradients, i.e., including the frequency-coding gradient, is necessary for arbitrary slice orientation. For gradients which are generated by means of a resonant circuit, however, difficulties are encountered using conventional techniques, as are described below with reference to FIGS. 1 through 7.

As is known, a topical resolution of the nuclear magnetic resonance signals in a magnetic resonance imaging apparatus is achieved by superimposing a magnetic field gradient on a uniform, static fundamental field, on the order of magnitude of 1 Tesla. The principles of such imaging are set forth in the article "NMR-Imaging Techniques and Applications: A Review", Bottomly, Review of Scientific Instrument, 53(9), September, 1982, pages 1319–1337.

For topical resolution in three dimensions, magnetic field gradients in three directions, preferably orthogonally disposed, must be produced. The x, y, z axes of a Cartesian coordinate system are shown in FIG. 1 to indicate the direction of the physical gradients $G_x$, $G_y$ and $G_z$ produced by the gradient coils in the system of FIG. 1. The gradient coils 2, in the form of saddle coils, generate a physical magnetic field gradient $G_y$ in the y-direction. A substantially constant magnetic field gradient $G_y$ in the y-direction is generated within a spherical examination volume 4 by the conductor sections 2a. Due to their greater distance from the examination volume 4, the return conductors produce only negligible magnetic field components in the examination volume 4.

The gradient coils for generating the physical magnetic field gradients in the x-direction are constructed identically to the gradient coils 2 for the y-direction magnetic field gradient, but are rotated 90° in azimuthal direction of the cylindrical carrier 1. For clarity, these gradient coils are therefore not shown in FIG. 1.

The gradient coils 3 for generating the physical magnetic field gradient in z-direction are annular, and are arranged symmetrically relative to the center point of the examination volume 4. The two individual coils 3a and 3b respectively carry current flowing in opposite directions, as indicated in FIG. 1, so as to produce a magnetic field gradient in z-direction.

A typical pulse sequence of the EPI method is set forth below.

At the beginning of the pulse sequence, the examination subject is subjected to a radio-frequency excitation pulse RF, shown in FIG. 2, in the presence of the positive portion SS+ of a slice-selection gradient SS in the z-direction, as shown in FIG. 3. Nuclear spins in a slice of the examination subject are thus excited. Subsequently, the direction of the slice selection gradient is inverted, so that the negative portion SS− of the gradient SS cancels the dephasing of the nuclear spins caused by the positive portion SS+ of the gradient SS.

After the excitation, a phase-coding gradient PC, shown in FIG. 4, or PC' shown in FIG. 5, is activated in the y-direction, and a read-out gradient RO, shown in Figure 6, is activated in x-direction. The read-out gradient consists of a pre-pulse ROV and a sequence of sub-pulses RO of alternating polarity.

Due to the alternating polarity of the read-out gradient RO, the nuclear spins are alternatingly dephased and rephased, so that a sequence of signals S arises, as shown in FIG. 7. After a single excitation with the ratio-frequency pulse RF, so many signals are acquired that the entire Fourier K-space is scanned, i.e., the data obtained with a single pulse RF are sufficient for reconstruction of the complete tomogram.

A phase coding is also implemented in addition to the read-out gradient RO which effects the frequency coding. Two possibilities for such phase coding are shown. In the exemplary embodiment of FIG. 4, the phase-coding gradient PC is constantly activated during the sequence. The phase of the nuclear spins thus continuously increases during the sequence. In the exemplary embodiment of FIG. 5, a brief phase-coding pulse PC' is activated at each change in the operational sign of the read-out gradient RO, so that the phase relation of the nuclear spins increases step-by-step over the pulse sequence. In both versions, the actual phase-coding pulses PC or PC' are preceded by respective pre-phasing pulses PCV or PCV'.

The nuclear magnetic resonance signal S arises under each pulse RO of the read-out gradient, the signal S being sampled in the time domain at defined times. The sampled signals are digitized and the numerical values acquired in this manner are entered in a raw data matrix. The raw data matrix can be considered a measured data space, and is thus a measured data plane in the two-dimensional case described in the exemplary embodiment. This measured data space is known to those in the art as "K-space."

The information regarding the spatial origin of the signal contributions S needed for the imaging is coded in the phase factors, the relationship between the locus space (i.e., the image) and the K-spaced existing mathematically via a two-dimensional Fourier transformation, as expressed by the following relationship.

$$S(K_x, K_y) = \int \int \rho(x,y) \exp[i(K_x x + K_y y)] dx dy.$$

wherein $$K_x(t) = \gamma \int_0^t G_x(t') dt', \text{ and}$$

$$K_y(t) = \gamma \int_0^t G_y(t') dt', \text{ and}$$

$\rho$ = nuclear magnetic density,
$\gamma$ = gyromagnetic ratio,
$G_x(t')$ = momentary value of the read-out gradient RO, and
$G_y(t)$ = momentary value of the phase-coding gradient PC.

When, as shown in the aforementioned example, the slice gradient SS is produced only by means of a gradient coil (i.e., the slice selection gradient SS is a physical gradient), such as the physical gradient $G_z$ in the example, the position or attitude of the slice, and thus of the tomogram which is acquired, is limited to slices which lie perpendicularly relative to the z-axis. The phase-coding gradient PC and the read-out gradient RO must always lie orthogonally relative to each other and relative to the slice-selection gradient SS. This is most simply achieved by producing the phase-coding gradient PC exclusively with either one of the physical gradients $G_y$ or $G_{y}$ and the read-out gradient RO is produced exclusively with the physical gradient $G_x$.

In conventional methods which do not use resonant gradients, it is nonetheless possible to produce arbitrarily spatially oriented slices or sections by forming logic gradients using the components from the physical gradients $G_x$, $G_y$ and $G_z$ to generate the slice selection gradient SS, the phase-coding gradient PC and the read-out gradient RO. In order to produce such a resulting gradient (referred to below as a "logic" gradient) having an arbitrary spatial orientation, all of the physical gradients $G_x$, $G_y$ and $G_z$ must be capable of being simultaneously activated with respectively selected amplitudes. As set forth in FIGS. 3 through 6, however, this is not possible given resonantly switched gradients without undertaking further steps.

As already mentioned, the arbitrary spatial orientation of a logic gradient requires the possibility of simultaneously activating the three physical gradients $G_x$, $G_y$ and $G_z$. This means that all three gradient coils would have to be selected with a direct current for forming a logic phase-coding gradient PC in the form of FIG. 4. At the same time, however, the three gradient coils would have to be resonantly operated to form the read-out gradient RO in the form of FIG. 6. It is impossible, however, to simultaneously operate a gradient coil in a resonant circuit and charge it with a direct current.

If a logic gradient PC' in the form of FIG. 5 is used, all of the gradient coils could be operated in resonance. The resonant frequency, however, for producing the logic phase-coding gradient PC' would have to be a different frequency than that for producing the logic read-out gradient RO, because the phase-coding pulses PC' are significantly shorter than the read-out pulses RO. It is not possible to generate both pulses RO and PC' with different frequencies at the same time.

In the aforementioned Weisskopf et al. article, the production of tilted slices is discussed, with a phase-coding gradient corresponding to FIG. 5 being used. In the article, however, it is proposed that only a conventional y-gradient and a conventional z-gradient, (i.e., gradients not produced by resonance) are combined, which is possible without problems. A frequency-coding gradient (or a read-out gradient) produced by means of resonance is not involved in the combination discussed in the article, so that the above-described difficulties are not present. Using the techniques disclosed in the Weisskopf article, however, an arbitrary slice position or attitude cannot be achieved, because the gradient combination employs only two physical gradients.

SUMMARY OF THE INVENTION

It is an object of the present invention to provide a method for operating a magnetic resonance imaging apparatus wherein at least one gradient coil is operated in a resonant circuit in a manner such that arbitrarily spatially oriented slices can be achieved.

The above object is achieved in a method and a circuit for operating a magnetic resonance imaging apparatus wherein an examination subject is subjected to the following pulse sequence per scan. The examination subject is first subjected to an RF pulse, which excites nuclear spins in the subject. A logic read-out gradient consisting of a series of sub-pulses is then activated. A logic phase-coding gradient is activated simultaneously with the logic read-out gradient, the logic phase-coding gradient also consisting of a series of sub-pulses, with the sub-pulses of the logic phase-coding gradient being activated between the sub-pulses of the logic of the read-out gradient, with no chronological overlap. The resulting nuclear magnetic resonant signals obtained from the examination subject are digitized and entered into a row of a raw data matrix in the K-space per sub-pulse of the logic read-out gradient. The rows of the raw data matrix are ordered according to the phase factors defined by the logic phase-coding gradient.

Due to the absence of a chronological overlap of the logic gradients, the aforementioned problems associated with combining logic gradients do not arise.

DESCRIPTION OF THE PREFERRED EMBODIMENTS

The pulse sequence for the logic gradients SS, PC and RO shown in FIGS. 8 through 11 differs from the sequence according to FIGS. 2 through 8 (which include the phase-coding gradient $G_y$, of FIG. 5) in that the logic read-out gradient RO (FIG. 11) is interrupted during the individual pulses of the phase-coding gradient PC. The logic phase-coding gradient PC and the logic read-out gradient RO are thus not simultaneously activated; they do not overlap. The phase-coding gradient PC and the read-out gradient RO can therefore be realized in an arbitrary spatial orientation on the basis of physical gradients $G_x$, $G_y$ and $G_z$, even if one or more of these gradients is produced in resonant fashion. The logic slice-selection gradient SS is achieved in the exemplary embodiment by conventionally switched physical gradients $G_x$, $G_y$ and $G_z$, however, resonant gradients, may also be used to produce that logic gradient.

Figure 15:
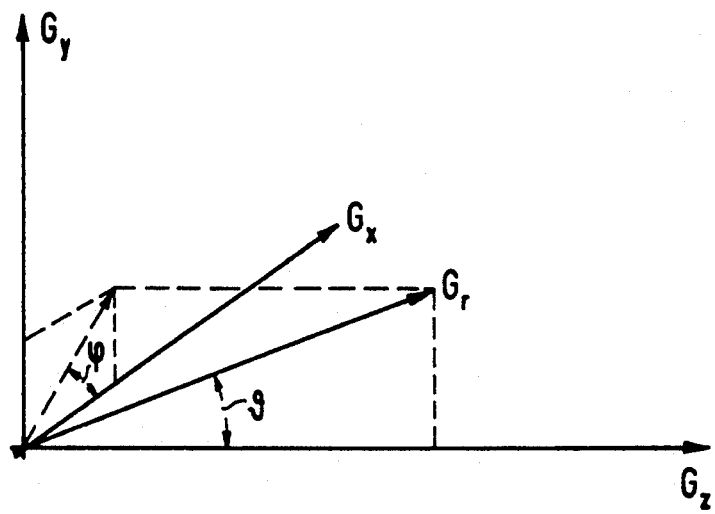
FIG. 15 shows the resulting gradient in the method of the invention in spherical coordinates.

As described above, each logic gradient is formed as the resultant of three physical gradients in the general case. A logic gradient referenced $G_r$ is shown in FIG. 15 in a coordinate system defined by the directions of the physical gradients $G_x$, $G_y$ and $G_z$. The same gradient is shown in a spherical coordinate system wherein the angle of the logic gradient $G_r$ with respect to the $G_x$, $G_z$ plane is referenced $\theta$ and the angle with respect to the $G_x$, $G_y$ plane is referenced $\phi$. The physical gradients $G_x$, $G_z$ and $G_y$ can be derived from the logic gradient $G_r$ according to the following relations:

$$G_x = G_r \cos\theta \sin\phi$$

$$G_y = G_r \sin\theta \sin\phi$$

$$G_z = G_r \cos\theta.$$

The required physical gradients $G_x$, $G_y$ and $G_z$ for each logic gradient SS, PC and RO can thus be calculated at any time in the sequence.

Figure 1:
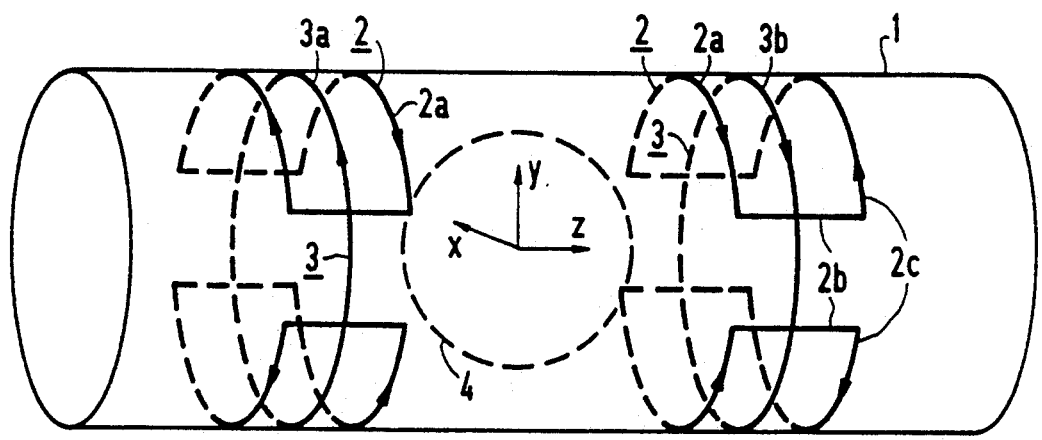
FIG. 1 schematically shows the arrangement of gradient coils relative to a Cartesian coordinate system in a conventional magnetic resonance imaging system, the arrangement also being suitable for use in the method and apparatus according to the principles of the present invention.
Figure 2:
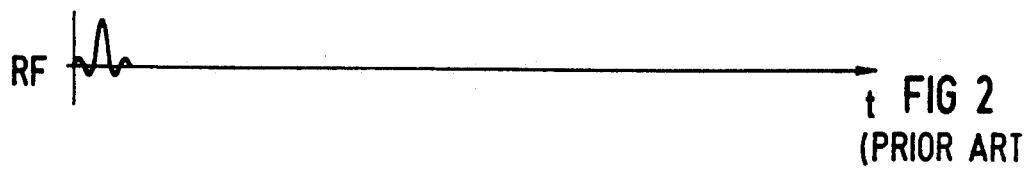
FIG. 2 shows a radio-frequency excitation pulse for explaining a conventional EPI sequence.
Figure 3:
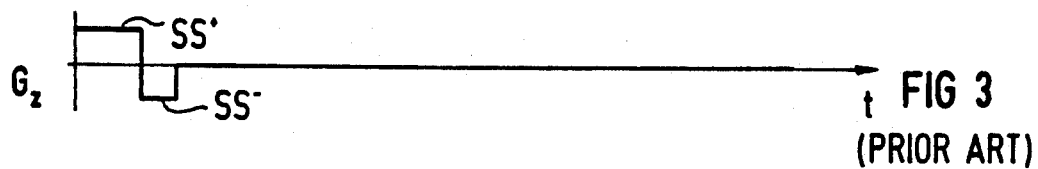
FIG. 3 shows a physical gradient in the z-direction for explaining a conventional EPI sequence.
Figure 4:
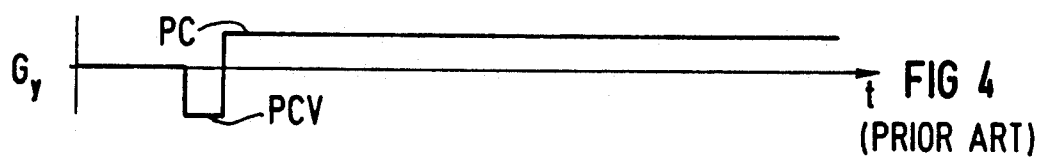
FIG. 4 is a first embodiment of a physical gradient in the y-direction for explaining a conventional EPI sequence.
Figure 5:
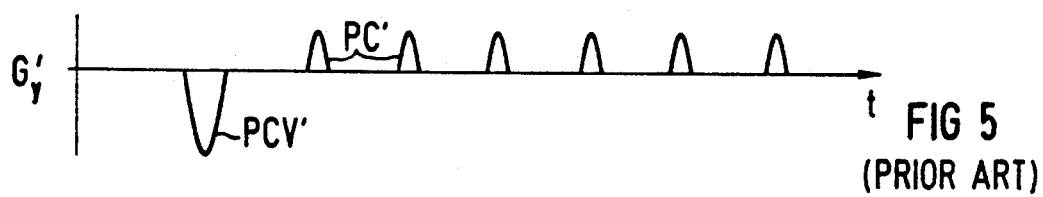
FIG. 5 shows a second embodiment of a physical gradient in the y-direction for explaining a conventional EPI sequence.
Figure 6:
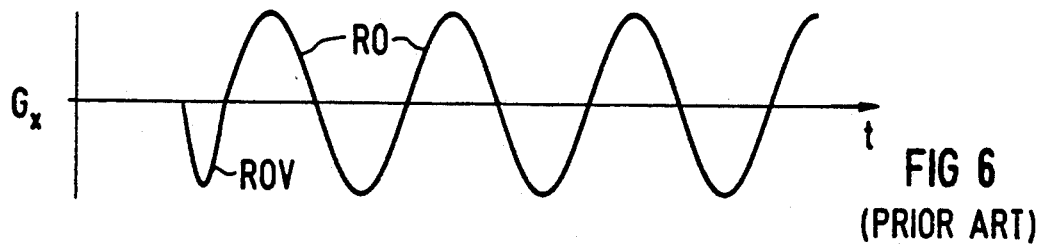
FIG. 6 shows a gradient in the x-direction for explaining a conventional EPI sequence.
Figure 7:
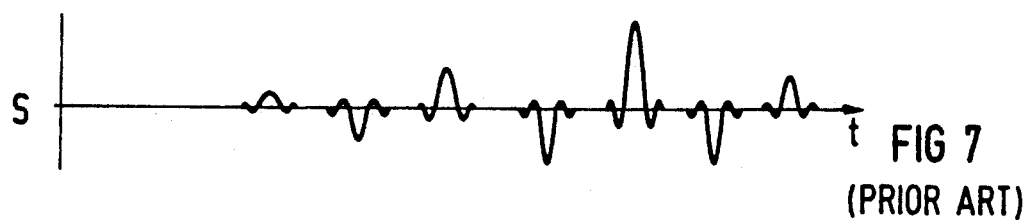
FIG. 7 shows the nuclear magnetic resonance signal S which results in a conventional EPI sequence.
Figure 8:
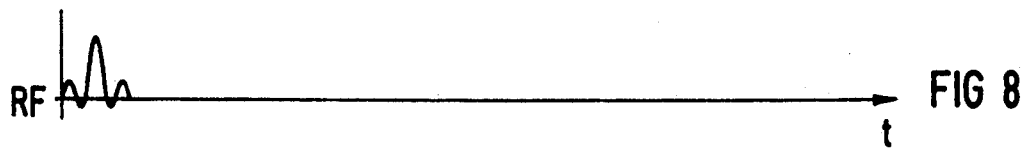
FIG. 8 shows a radio-frequency pulse for explaining the method of the invention.
Figure 9:
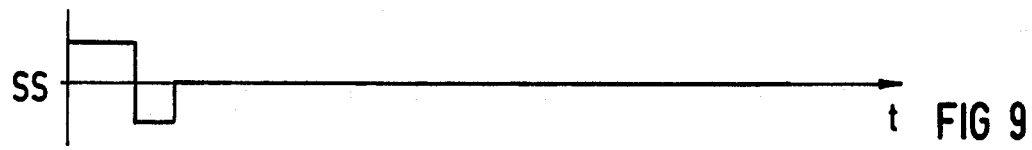
FIG. 9 shows a logic slice-selection gradient for explaining the method of the invention.
Figure 10:
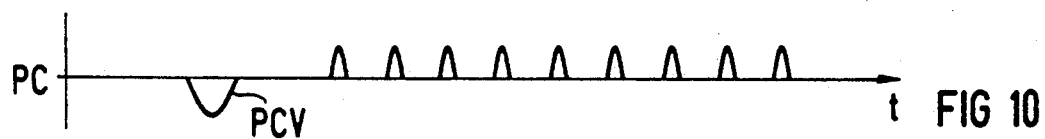
FIG. 10 shows a logic phase-coding gradient for explaining the method of the invention.
Figure 11:
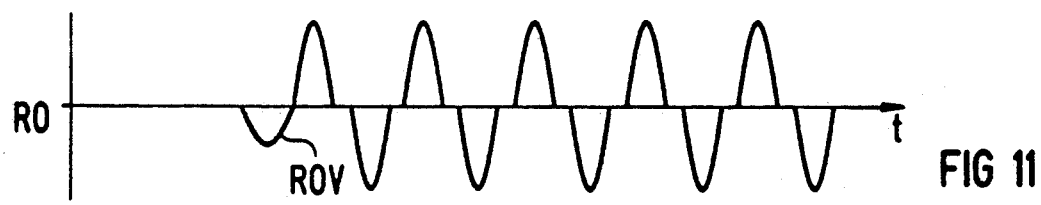
FIG. 11 shows a logic readout-gradient for explaining the method of the invention.
Figure 12:
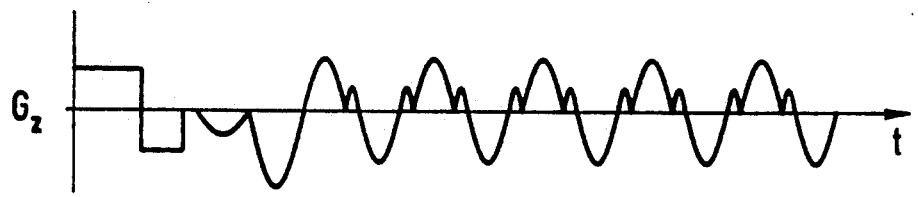
FIG. 12 shows a physical gradient in the z-direction for explaining the method of the invention.
Figure 13:
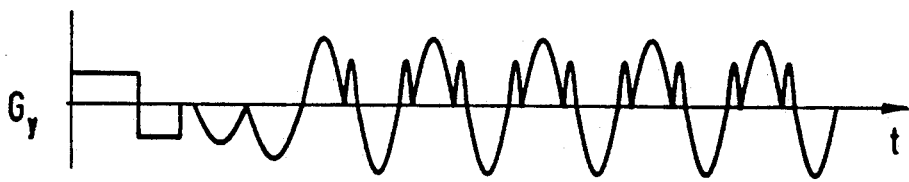
FIG. 13 shows a physical gradient in the y-direction for explaining the method of the invention.
Figure 14:
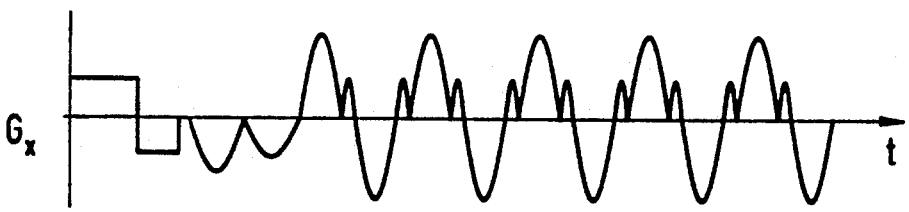
FIG. 14 shows a physical gradient in the x-direction for explaining the method of the invention.

Examples of the physical gradients $G_x$, $G_y$ and $G_z$ required for generating the logic gradients according to FIGS. 9 through 11 in a prescribed direction are respectively shown in FIGS. 12 through 14. Due to the absence of an overlap among the logic gradients SS, PC and RO, the required physical gradients can be technically generated in a conventional mode (during the slice selection) as well as in a resonant mode (during the remaining sequence duration).

As can be seen in FIG. 11, the chronological gaps between the sub-pulses of the logic read-out gradient RO coincide with the zero-axis crossings of that gradient, and the sub-pulses of the logic phase-coding gradient PC (as can be seen from FIG. 10) coincide with the zero-axis crossings of the logic read-out gradient RO. As used herein, the term "coincides" is not limited to instantaneous coincidence at a single point in time, but encompasses a region of finite chronological duration preceding and following the precise point of zero-axis crossing.

The resonant frequencies of the respective gradient coils must be constantly switched during the sequence, because the individual sub-pulses of the phase-coding gradient PC, and thus the allocated pulses of the physical gradients $G_x$, $G_y$ and $G_z$, are significantly shorter than the individual sub-pulses of the read-out gradient RO. This, can be achieved by switching capacitors in the resonant circuit connected to the gradient coil. The sub-pulses of the logic phase-coding gradient PC should be optimally short in order to maintain the required interruption of the logic read-out gradient RO as short as possible. This is technologically possible without significant outlay due to the resonant operation when producing the individual pulses of the phase-coding gradient PC.

Figure 16:
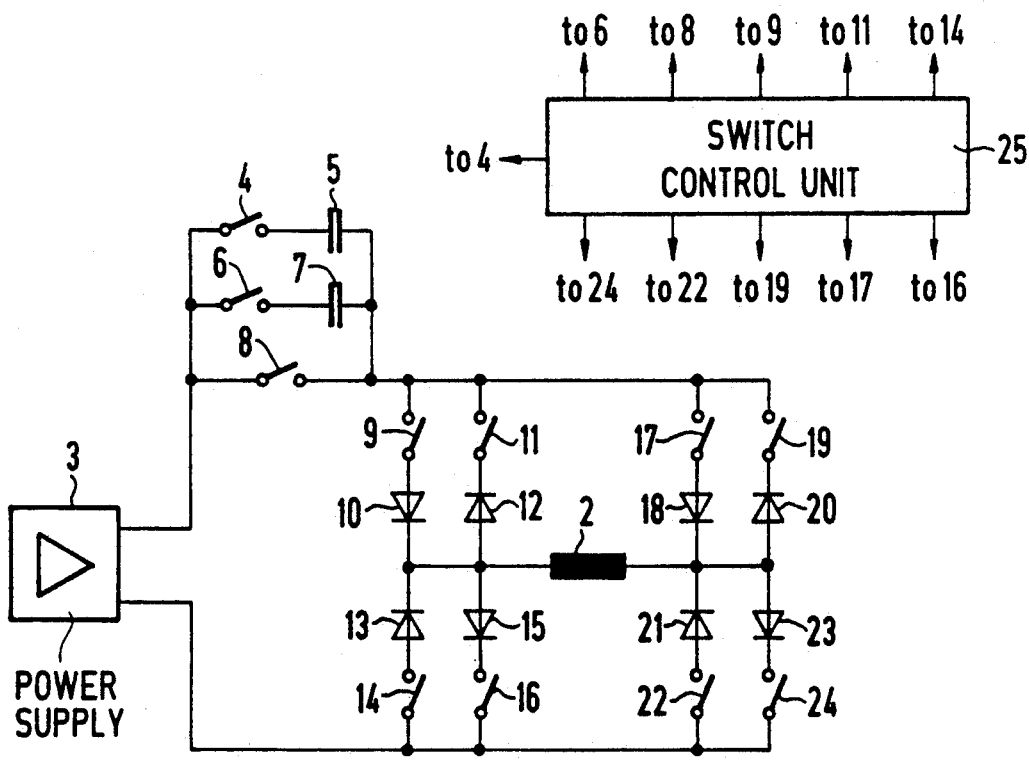
FIG. 16 shows a schematic circuit diagram of a circuit for operating a coil system of the type shown in FIG. 1 in accordance with the principles of the present invention.

An exemplary embodiment of a drive circuit for the gradient coil 2 is shown in FIG. 16, it being understood that the drive circuits for producing the physical gradients $G_x$, $G_y$ and $G_z$ do not differ. The gradient coil 2 is fed by a gradient power supply 3. The gradient coil 2 is connected in a bridge circuit having four arms. Two oppositely polarized diodes are connected in parallel in each bridge arm, forming diode pairs 10 and 12, 13 and 15, 17 and 19, and 21 and 23. Each diode has a switch connected in series therewith, forming switch pairs 9 and 11, 14 and 16, 17 and 19, and 22 and 24. Dependent on the state of the switches, therefore, the rectifier bridge circuit can be operated to cause current to flow through the coil 2 in either direction, as described in detail below.

At its input side, the bridge circuit is directly connectable to the gradient power supply 3 via a switch 4 and a capacitor 5, or via a switch 6 and a capacitor 7, or via a switch 8.

The control of the illustrated switches ensues, by means of a schematically indicated switch control unit 25, which may be a computer, in the following manner within the framework of the pulse sequence shown in FIGS. 8 through 14:

As described above, the slice selection gradient SS is produced in a conventional, (i.e., non-resonant manner).

The feed of the gradient current for the slice selection gradient SS therefore ensues via the switch 8. The slice selection gradient SS is bipolar, and therefore the switches 9 and 11 and 22 and 24 are closed, so that a current flow through the bridge circuit and through the gradient coil in both directions is possible.

The further gradient pulses are resonantly produced, so that one of the capacitors 5 or 7 must be connected in series with the gradient coil 2. The individual pulses of the logic phase-coding gradient PC are noticeably shorter than the individual pulses of the logic read-out gradient RO, so that a series resonant circuit having a higher resonant frequency (i.e., having a smaller capacitor) is used for generating the logic phase-coding gradient PC than is used for generating the logic read-out gradient RO.

In the exemplary embodiment, the capacitor 5 has a smaller capacitance than the capacitor 7.

The pre-phasing pulse PCV of the logic phase-coding gradient PC is relatively long in comparison to the subsequent sub-pulses, so that the lower resonant frequency, i.e., the larger capacitor 5, is used, and therefore the switch 6 is closed. Because the pre-phasing pulse PCV of the logic phase-coding gradient PC is negative, the switches 16 and 17 are closed in the bridge circuit for generating the pre-phasing pulse PCV.

The pre-phasing pulse ROV of the logic read-out gradient RO is also relatively long, and is negative, so that the series resonant circuit of the gradient coil 2 with the larger capacitor 7 is activated. In order to make the pre-phasing gradient ROV negative, the switches 16 and 17 are again closed. The sub-pulses of the logic phase-coding gradient PC all have the same polarity, so that the bridge circuit must be switched as a rectifier bridge circuit, i.e., the switches 9, 14, 19 and 24 are closed. A high resonant frequency is required because of the short duration of the sub-pulses of the logic phase-coding gradient PC, and therefore the capacitor 5 is connected to the gradient coil 2 to form a resonant circuit via the switch 21 during the sub-pulses of the phase-coding gradient PC.

The individual pulses of the read-out gradient RO, by contrast, have alternating polarity, and therefore rectification cannot take place. Instead, a flow of current through the gradient coil 2 must be possible in both directions. This is achieved, for example, by closing the switches 9, 11, 22 and 24. The individual pulses of the read-out gradient RO are relatively long, and therefore the capacitor 7 is connected to the gradient coil 2 to form a series resonant circuit for the duration of these individual pulses by closing the switch 6.

In order that the series resonant circuits begin to oscillate with the desired, full amplitude, the capacitors 5 and 7 must be charged before the beginning of the sequence. This can be accomplished in a known manner, and therefore the details of such a charging circuit are not shown in FIG. 16.

The respective series circuits of a diode and associated switch in the bridge circuit can be replaced by respective thyristors, driven in the manner described above for the series circuits.

Although other modifications and changes may be suggested by those skilled in the art, it is the intention of the inventor to embody within the patent warranted hereon all changes and modifications as reasonably and properly come within the scope of his contribution to the art.

We claim as our invention:

1. A method for operating magnetic resonance imaging tomography apparatus having three sets of gradient coils for respectively generating physical magnetic field gradients oriented orthogonally relative to each other, said method producing arbitrarily oriented logic gradients which are orthogonally disposed relative to each other by a combination of components of said physical magnetic field gradients, said method comprising the steps, per scan of an examination subject, of:

operating at least one of said sets of gradient coils in a resonant circuit;
   subjecting said examination subject to a radio-frequency pulse to excite nuclear spins in said examination subject;
   subjecting said examination subject to a logic read-out gradient generated in an arbitrary first direction by a combination of said sets of gradient coils and consisting of a plurality of chronologically spaced sub-pulses;
   subjecting said examination subject to a logic phase-coding gradient generated in a second direction by a combination of said sets of gradient coils, simultaneously with said logic read-out gradient, and having a plurality of chronologically spaced sub-pulses occurring between said sub-pulses of said logic read-out gradient with said sub-pulses of said logic read-out gradient and said logic phase-coding gradient having no chronological overlap at any time;
   acquiring analog nuclear magnetic resonant signals from said examination subject in the presence of said logic read-out gradient and said logic phase-coding gradient;
   digitizing said analog nuclear magnetic resonance signals to obtain digital raw data signals; and
   writing said digital raw data signals into a raw data matrix in the K-space per sub-pulse of said logic read-out gradient and ordering the rows of said raw data matrix according to phase factors defined by said logic phase-coding gradient.

2. A method as claimed in claim 1 wherein the step of subjecting said examination subject to a logic read-out gradient is further defined by subjecting said examination subject to a logic read-out gradient having a plurality of zero-axis crossings with said chronological spacing between said sub-pulses of said logic read-out gradient coinciding with said zero-axis crossings.

3. A method as claimed in claim 1 comprising the additional step of:

during both steps of subjecting said examination subject to said logic read-out gradient and to said logic phase-coding gradient, operating all of said sets of gradient coils in respective resonant circuits.

* * * * *